(12) United States Patent
Sathe et al.

(10) Patent No.: US 8,952,511 B2
(45) Date of Patent: Feb. 10, 2015

(54) INTEGRATED CIRCUIT PACKAGE HAVING BOTTOM-SIDE STIFFENER

(75) Inventors: Ajit V. Sathe, Chandler, AZ (US); Mat J. Manusharow, Phoenix, AZ (US); Tong Wa Chao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 666 days.

(21) Appl. No.: 11/959,331

(22) Filed: Dec. 18, 2007

(65) Prior Publication Data

US 2009/0152738 A1 Jun. 18, 2009

(51) Int. Cl.
*H01L 23/02* (2006.01)
*H05K 3/30* (2006.01)
*H01L 23/50* (2006.01)

(52) U.S. Cl.
CPC ............... *H05K 3/303* (2013.01); *H01L 23/50* (2013.01); *H05K 2201/10734* (2013.01); *H05K 2201/2018* (2013.01); *H05K 2204/2036* (2013.01); *H01L 2224/16* (2013.01); *H01L 2924/15311* (2013.01)
USPC ............................ 257/678; 257/734; 257/787

(58) Field of Classification Search
CPC ................... H01L 2924/15311; H01L 25/105; H01L 2224/16
USPC .......... 257/E23.127, 193, 666–787; 156/329; 439/67; 228/180.22
See application file for complete search history.

(56) References Cited

U.S. PATENT DOCUMENTS

| | | | | |
|---|---|---|---|---|
| 4,878,611 A | * | 11/1989 | LoVasco et al. | 228/180.22 |
| 5,435,732 A | * | 7/1995 | Angulas et al. | 439/67 |
| 5,523,628 A | * | 6/1996 | Williams et al. | 257/777 |
| 5,866,943 A | * | 2/1999 | Mertol | 257/712 |
| 6,369,451 B2 | * | 4/2002 | Lin | 257/779 |
| 6,472,762 B1 | * | 10/2002 | Kutlu | 257/778 |
| 6,573,122 B2 | * | 6/2003 | Standing | 438/118 |
| 6,593,652 B2 | * | 7/2003 | Shibata | 257/710 |
| 6,682,802 B2 | | 1/2004 | Hsieh et al. | |
| 6,710,444 B2 | | 3/2004 | Xie et al. | |
| 6,798,137 B2 | | 9/2004 | Ishida | |
| 6,824,041 B2 | * | 11/2004 | Grieder et al. | 228/180.22 |
| 6,848,172 B2 | | 2/2005 | Fitzgerald et al. | |
| 6,903,278 B2 | | 6/2005 | Sathe | |
| 7,045,890 B2 | | 5/2006 | Xie et al. | |
| 7,208,342 B2 | | 4/2007 | Lee et al. | |
| 7,259,456 B2 | * | 8/2007 | Wang | 257/707 |
| 2001/0013392 A1 | * | 8/2001 | Carden et al. | 156/329 |
| 2003/0030140 A1 | * | 2/2003 | Shim | 257/712 |
| 2006/0043548 A1 | * | 3/2006 | Kanda et al. | 257/678 |
| 2006/0220224 A1 | * | 10/2006 | Cheng | 257/706 |
| 2007/0120149 A1 | | 5/2007 | Frutschy et al. | |

* cited by examiner

*Primary Examiner* — Kenneth Parker
*Assistant Examiner* — Fang-Xiang Jiang
(74) *Attorney, Agent, or Firm* — Blakely, Sokoloff, Taylor & Zafman LLP

(57) ABSTRACT

Embodiments of a bottom-side stiffening element are disclosed. The stiffening element may be disposed between an integrated circuit package and an underlying circuit board. In some embodiments, the stiffening element is attached to the underlying circuit board. Other embodiments are described and claimed.

9 Claims, 3 Drawing Sheets

US 8,952,511 B2

INTEGRATED CIRCUIT PACKAGE HAVING BOTTOM-SIDE STIFFENER

FIELD OF THE INVENTION

The disclosed embodiments relate generally to integrated circuit packages, and more particularly to a bottom-side stiffener that may reduce package warpage and, in some embodiments, perform one or more additional functions.

BACKGROUND OF THE INVENTION

An integrated circuit (IC) die may be disposed in a package to support the die, as well as to aid in forming electrical connections between the die and a next-level component, such as a motherboard or other circuit board. The package typically includes a substrate to which the die is both mechanically and electrically coupled. For example, the IC die may be coupled to the substrate by an array of interconnects in a flip-chip arrangement, with a layer of underfill disposed around the interconnects and between the die and substrate. Each of the interconnects may comprise a solder bump disposed on a terminal (e.g., bond pad, copper pillar, etc.) of the die that is attached by a solder reflow process to a mating terminal (e.g., pad, pillar, etc.) on the substrate. Alternatively, by way of further example, the IC die may be attached to the substrate by a layer of die attach adhesive, and a plurality of wire bonds may be formed between the die and substrate.

The IC die is disposed on one side of the substrate, and a number of electrically conductive terminals are formed on an opposing side of the substrate. The terminals on the opposing side of the substrate will be used to form electrical connections with the next-level component (e.g., a circuit board), and these electrical connections can be used to deliver power to the die and to transmit input/output (I/O) signals to and from the die. The electrically conductive terminals on the substrate's opposing side may comprise an array of pads (or lands, pillars, etc.) to which solder bumps have been attached, and these solder bumps may be electrically coupled to a corresponding array of pads (or other terminals) on the circuit board by a reflow process.

For some types of integrated circuit devices, the I/O requirements are increasing with each design generation. Even with reductions in the pitch (e.g., the distance between adjacent interconnects), larger package substrates are needed in some instances to accommodate the increased I/O (e.g., to provide greater surface area upon which interconnects can be formed). However, as the substrate increases in size, the potential for warpage also rises. It is known to place a stiffener on the upper, or die-side, of the package substrate, but the decrease in compliance provided by the stiffener increases the risk of shock-related failures.

DETAILED DESCRIPTION OF THE INVENTION

Figure 1:
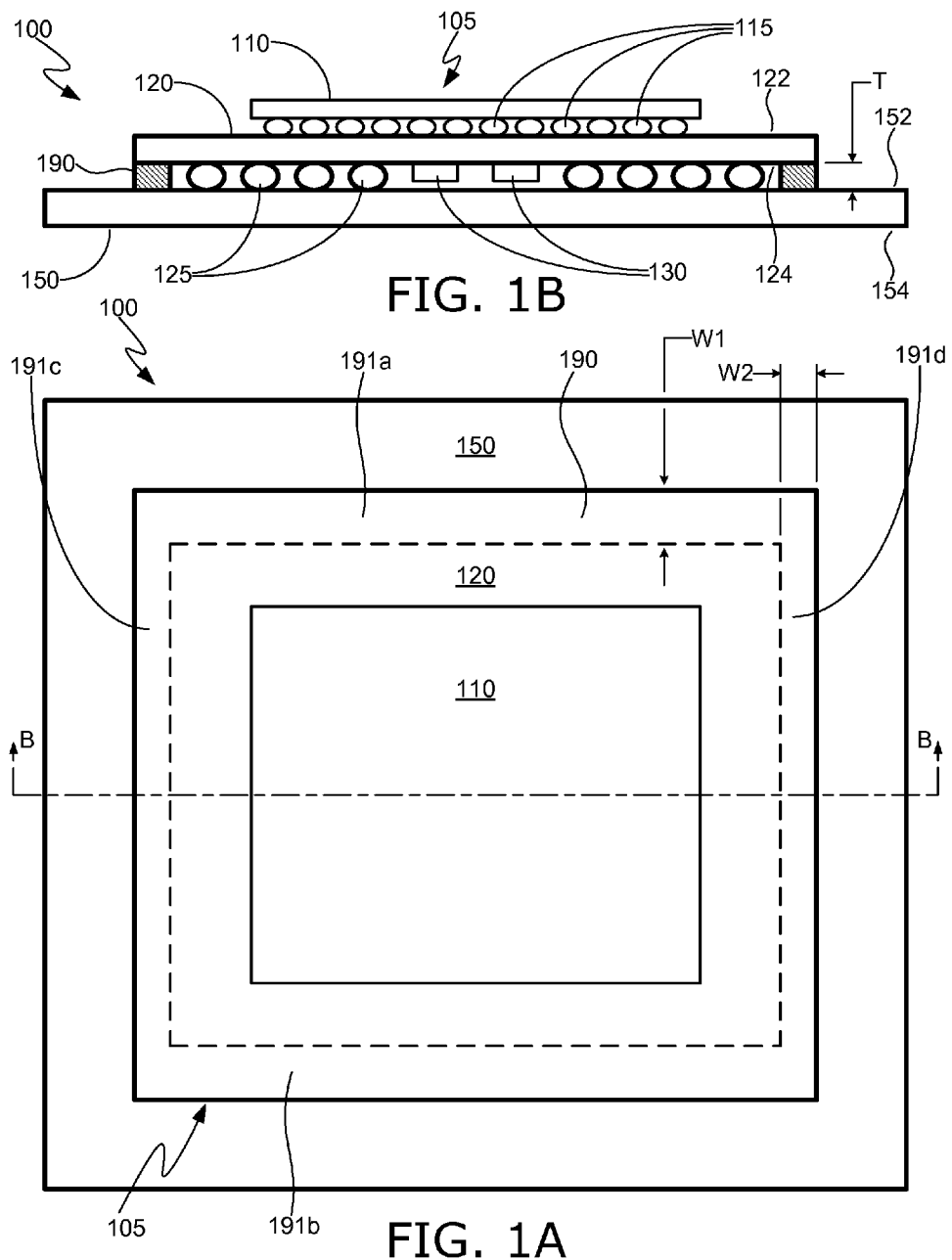
FIG. 1A is a schematic diagram illustrating a plan view of an integrated circuit assembly including an embodiment of a bottom-side stiffening element.
FIG. 1B is a schematic diagram illustrating a cross-sectional elevation view of the assembly of FIG. 1A, as taken along line B-B of FIG. 1A.

Illustrated in FIGS. 1A and 1B is an embodiment of an assembly 100 including an integrated circuit (IC) package 105 disposed on a circuit board 150. A plan view of the assembly 100 is shown in FIG. 1A, whereas FIG. 1B shows a cross-sectional elevation view of the assembly, as taken along line B-B of FIG. 1A. The assembly 100 may comprise any type of computing device. For example, the assembly 100 may comprise (or form part of) a hand-held computing device, a mobile computing device, a wireless communications device, a laptop computer, a desk-top computer, a server, etc.

As noted above, the assembly 100 includes an IC package 105. The IC package 105 includes an integrated circuit die 110 that is disposed on and electrically coupled with a substrate 120. Further, the IC package 105 is disposed on and electrically coupled with a circuit board 150. A bottom-side stiffening element 190 is disposed between the substrate 120 and the circuit board 150, and the stiffener 190 may decrease warpage of the package 105 while also increasing the assembly's resistance to shock. The stiffening element 190 may also perform one or more additional functions, such as functioning as a stand-off between board 150 and substrate 120 and/or delivering power to the IC package 105. Various embodiments of the bottom-side stiffening element 190 will now be described in greater detail.

With reference to FIGS. 1A and 1B, the IC package 105 includes an IC die 110 disposed on a first side 122 of substrate 120. The IC die 110 may comprise any suitable processing system, such as a microprocessor, a network processor, a graphics processor, a wireless communications device, a chipset, etc., as well as any combination of these and other systems or devices. In addition to IC die 110, one or more additional die and/or other components may be disposed in package 105. Other components that may be disposed within IC package 105 include a memory (e.g., a flash memory, any type of Dynamic Random Access Memory, etc.), a memory controller, a voltage regulator, as well as passive components (e.g., capacitors, filters, antennas, etc.). For example, in one embodiment, one or more capacitors 130 (e.g., decoupling capacitors for power delivery) are disposed on an opposing second side 124 of the substrate 120.

At this juncture, it should be noted that the first side 122 of substrate 120 may be referred to as the "upper side" or the "die-side" of the substrate, whereas the second side 124 of this substrate may be referred to as the "bottom side" or "land-side." The aforementioned terms, some of which may be used interchangeably in the text below, are used simply as a matter of convenience in describing the disclosed embodiments. However, it should be understood that these terms are used without limitation and, further, that these and other features of the disclosed embodiments may be referred to and described using alternative terminology.

Substrate 120 may comprise any suitable type of substrate capable of providing electrical communications between the IC die 110 (and perhaps other components, as noted above) and the underlying circuit board 150. The substrate 120 may also provide structural support for the die 110 (and other components). By way of example, in one embodiment, substrate 120 comprises a multi-layer substrate—including alternating layers of a dielectric material and metal—built-up around a core layer (either a dielectric or metal core). In another embodiment, the substrate 120 comprises a core-less multi-layer substrate. Other types of substrates and substrate materials may also find use with the disclosed embodiments (e.g., ceramics, sapphire, glass, etc.).

A number of interconnects 115 may extend between the IC die 110 and substrate 120. The interconnects 115 provide electrical connections between the die 110 and substrate 120, and these interconnects may also aid in mechanically securing the die to the substrate 120. In a further embodiment, a layer of underfill (not shown in figures) may be disposed between the IC die 110 and the substrate 120, and this underfill layer may also assist in securing the die to the substrate. The interconnects 115 may comprise any suitable type of interconnect and may comprise any suitable electrically conductive materials. According to one embodiment, the interconnects 115 comprise an array of solder bumps extending between the die 110 and substrate 120 (perhaps in combination with an array of copper columns extending from die 110 and/or substrate 110). A solder reflow process may be utilized to form the interconnects 115 between the die 110 and substrate 120. Of course, it should be understood that many other types of interconnects and materials are possible (e.g., wirebonds extending between the die 110 and substrate 120). Further, according to one embodiment, the substrate 120 may comprise alternating layers of dielectric material and metal that are built-up around the die 110 itself, this process sometimes referred to as a "bumpless build-up process." Where such an approach is utilized, the separate interconnects 115 may not be needed (since the build-up layers may be disposed directly over the die 110).

In one embodiment, the IC package 105 may also include a thermal solution (not shown in figures). For example, a lid or heat spreader (sometimes referred to as an integrated heat spreader, or IHS) may be disposed over and thermally coupled with die 110. The heat spreader may comprise any suitable thermally conductive material, such as, for example, copper or a copper alloy. A layer of a thermal interface material (or TIM) may be disposed between the die 110 and the heat spreader. The TIM layer comprises any material capable of thermally coupling (and perhaps mechanically securing) the heat spreader to die 110. Suitable thermal interface materials include, for example, solders and conductive polymers. In a further embodiment, a layer of epoxy or other adhesive may secure the lid or heat spreader to the underlying substrate 120. Also, in yet another embodiment, a heat sink may be thermally coupled to the heat spreader (or, alternatively, a heat sink may be directly thermally coupled with the die, in which case a heat spreader may be omitted).

As previously described, the IC package 105 is disposed on a circuit board 150. Circuit board 150 includes a first side 152 facing IC package 105 and an opposing second side 154. In one embodiment, the circuit board 150 comprises any substrate capable of providing electrical communication between the components disposed on the board. For example, the circuit board 150 may comprise a multi-layer structure comprised of alternating layers of a dielectric material and a metal (e.g., copper). Further, these dielectric build-up layers may be disposed over a core layer (e.g., a dielectric material or perhaps a metal core). Any one or more of the metal layers may be formed in a desired circuit pattern to route—perhaps in conjunction with other metal layers—electrical signals to and from the devices coupled with the circuit board 150. However, the disclosed embodiments are not limited to the above-described multi-layer circuit board, and it should be understood that the disclosed embodiments may find application to other types of substrates.

As suggested above, in addition to IC package 105, one or more additional components (not shown in figures) may be disposed on the circuit board 150. Additional components that may be disposed on circuit board 150 include, for example, a graphics display (e.g., a liquid crystal display, or LCD), passive components (e.g., antennas, capacitors, etc.), a cooling device (e.g., a fan or a passive cooling device, such as a heat sink), a retention mechanism (for securing a cooling solution to the package 105 and/or board 150), a voltage regulator, and/or a power supply (e.g., a battery), as well as other IC devices.

A number of interconnects 125 may extend between the substrate 120 and the circuit board 150. The interconnects 125 provide electrical connections between the IC package 105 and board 150, and these interconnects may also aid in mechanically securing the package to the board 150. The interconnects 125 may comprise any suitable type of interconnect and may comprise any suitable electrically conductive materials. In one embodiment, the interconnects 125 comprise an array of solder bumps extending between the substrate 120 and the circuit board 150 (perhaps in combination with an array of copper columns extending from substrate 120). A solder reflow process may be utilized to form the interconnects 125 between the substrate 120 and board 150.

As set forth above, the assembly 100 also includes a bottom-side stiffening element 190. The stiffening element 190 may be attached to the bottom surface 124 of substrate 120, and may extend between the substrate 120 and the circuit board 150. In one embodiment, the stiffener 190 increases the stiffness of IC package 105 and reduces the package's susceptibility to warpage, such as warpage resulting from mismatches in the coefficients of thermal expansion (CTE's) between the various components of assembly 100. In another embodiment, although the stiffening element may decrease the compliance of the package 105, by attaching the stiffener 190 to the circuit board 150, the stiffener can increase the assembly's resistance to shock-related failures. According to a further embodiment, the stiffener 190 functions as a standoff between the package 105 and the circuit board 150. Thus, after reflow of interconnects 125, the stiffening element 190 can prevent solder collapse and maintain a desired gap between substrate 120 and board 150 after solder reflow, thereby maintaining clearance for passive components such as capacitors 130. In yet another embodiment, the stiffening element 190 is utilized to deliver power to the IC package 105 (and/or to ground the package).

The stiffening element 190 may have any suitable shape and configuration, and this structure may be comprised of any suitable material or combination of materials. According to one embodiment, the stiffener 190 comprises a generally rectangular-shaped frame, as shown in FIGS. 1A and 1B. However, it should be understood that other shapes may be suitable. In one embodiment, as shown in FIG. 1B, two opposing lengths 191a, 191b of the frame-shaped stiffener 190 have a width W1 that is greater than a width W2 of the other two opposing sides 191c, 191d of the stiffener. According to another embodiment, the sides 191a-d of the frame-shaped stiffener are of substantially equal width. In other embodiments, any of the lengths 191a-d of frame-shaped stiffener 190 may have a width that differs from the width of any one or more of the other lengths of the stiffener. According to one embodiment, as shown in the figures, the stiffening element 190 is disposed proximate the periphery of the substrate 120 and extends fully around this periphery. However, the location of the bottom-side stiffener is not limited to the periphery of the substrate 120, and in other embodiments this structure may be disposed at alternative locations.

The thickness T of the stiffening element 190 will, in one embodiment, be selected based upon the size of any land-side capacitors 130 and the desired height of the interconnects 125 (and perhaps other factors). According to one embodiment, the stiffener 190 has a substantially uniform thickness T. However, in other embodiments, a portion of the stiffening element 190 may have a thickness that is different than other portions of the stiffener. Further, because the stiffener 190 is positioned in the gap between the substrate 120 and circuit board 150 where the interconnects 125 are located, the bottom-side stiffener does not, in some embodiments, increase the overall height of the assembly 100.

As noted above, the stiffening element 190 may comprise any suitable material or combination of materials. In one embodiment, the stiffener comprises a metal, such as copper, aluminum, stainless steel, or other suitable metal. Other suitable materials may include plastics and composite materials. Also, in one embodiment, the stiffening element 190 includes an electrically conductive material (e.g., copper or aluminum, or alloys of these and/or other electrically conductive metals). The stiffener 190 may be fabricated by any suitable process or combination of processes, including, for example, stamping, machining, molding, etc.

Figure 2:
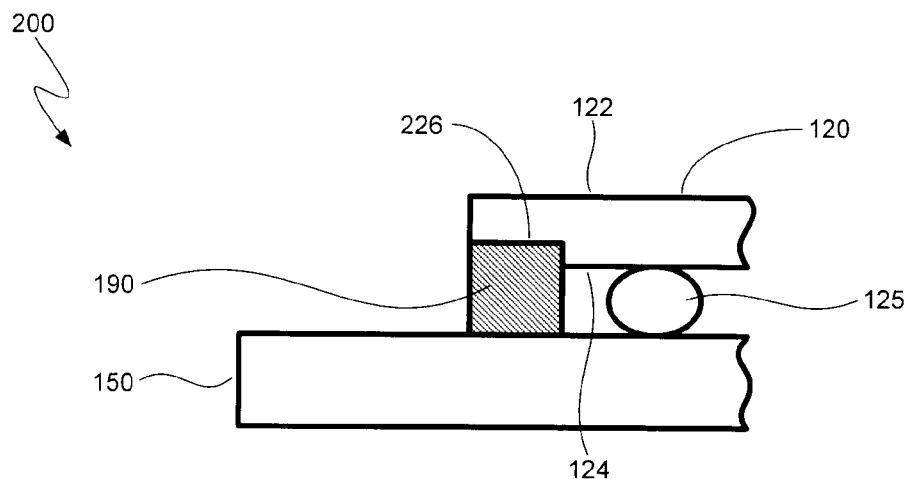
FIG. 2 is a schematic diagram illustrating another embodiment of a bottom-side stiffening element.

As noted above, the stiffening element 190 is secured to the second or bottom-side of the substrate 120. For example, the stiffener 190 may be attached to the substrate 120 by an adhesive (e.g., epoxy) or by solder. According to one embodiment, the stiffener 190 may be partially embedded in the substrate 120. For example, as shown in FIG. 2, the stiffening element 190 may be embedded in a groove 226 formed in the substrate 120. In a further embodiment, as previously suggested, the stiffener 190 may also be coupled with the first side 152 of circuit board 150. Any suitable method or device may be employed to secure the stiffener 190 to the circuit board 150, including adhesive (e.g., epoxy), solder, or mechanical fasteners.

Figure 3:
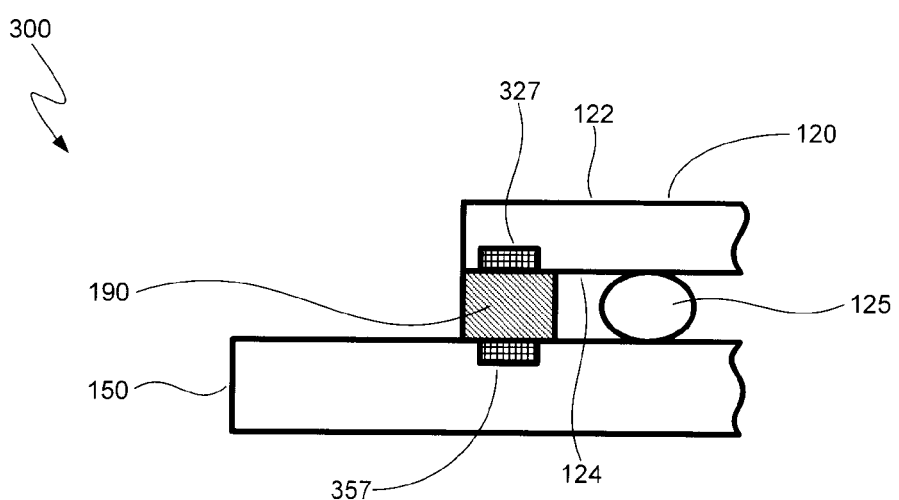
FIG. 3 is a schematic diagram illustrating a further embodiment of a bottom-side stiffening element.

As set forth above, in one embodiment, the stiffening element 190 may be utilized to deliver power to the IC package 105 (and/or to ground the package 105 to circuit board 150). For example, referring to FIG. 3, the stiffener 190 may be electrically coupled to one or more conductors 327 in substrate 120 and also coupled to one or more conductors 357 in circuit board 150. The stiffener 190 may be electrically coupled with the conductors 327, 357 by solder or an electrically conductive adhesive (either of which may also mechanically secure the stiffener to the substrate 120 and/or board 150). Where solder is utilized to couple the stiffening element 190 to the substrate 120 and board 150, these solder joints may be created during the same reflow process performed to create interconnects 115 and/or interconnects 125. When the stiffener 190 is utilized for power delivery (and/or ground), the stiffener comprises or includes an electrically conductive material, such as copper or aluminum, or alloys of these and/or other electrically conductive metals.

Figure 4:
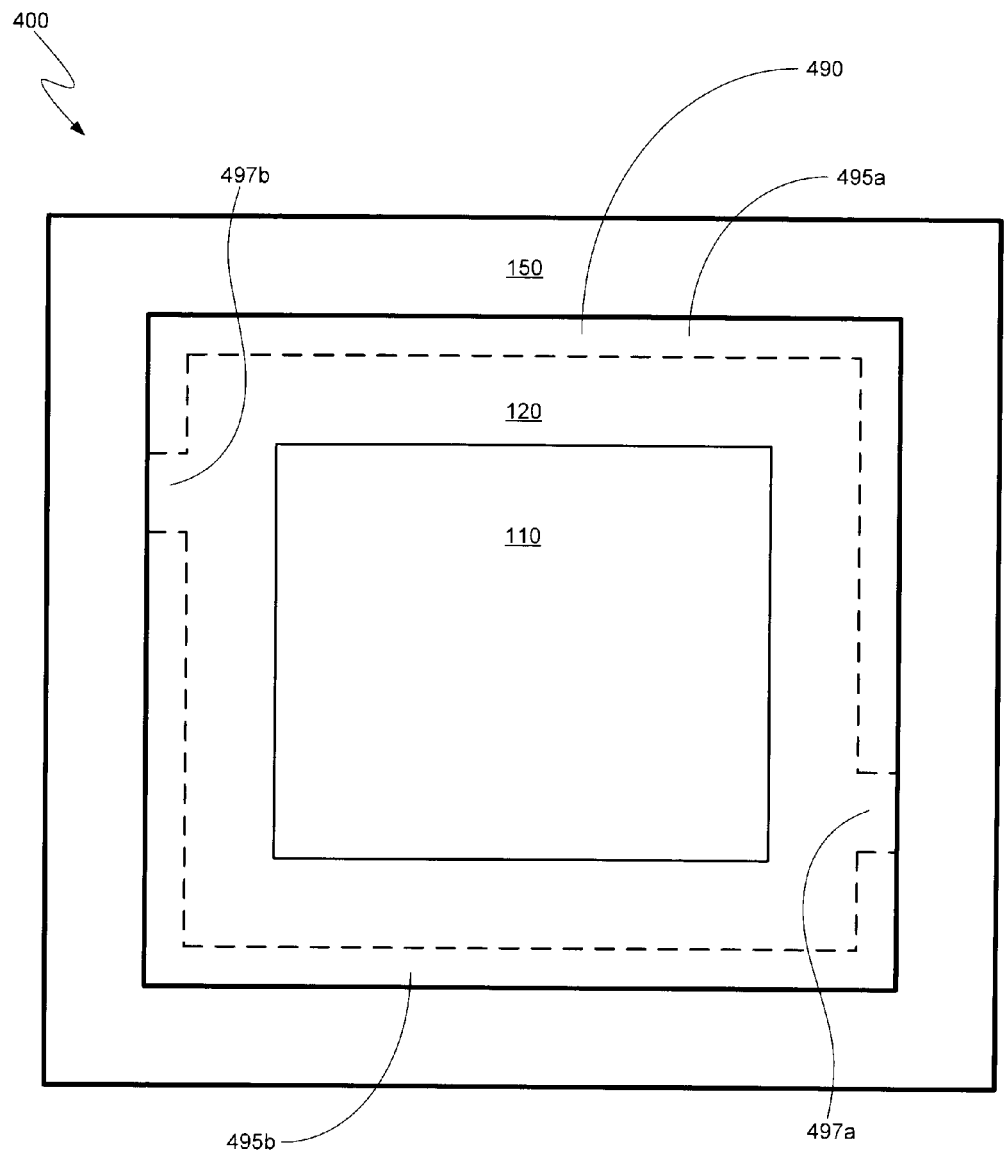
FIG. 4 is a schematic diagram illustrating yet another embodiment of a bottom-side stiffening element.

In the embodiment of FIGS. 1A and 1B, the stiffening element 190 comprised a single framed-shaped piece of material extending about a periphery of the substrate 120. However, in other embodiments, a bottom-side stiffener may comprise two or more discrete sections. For example, referring to FIG. 4, an assembly 400 includes a stiffening element 490 disposed between the substrate 120 and the circuit board 150, and this stiffener 490 comprises two sections 495a, 495b. Each section 495a, 495b extends around a portion of the substrate's perimeter, and gaps 497a, 497b exist between opposing ends of the stiffener sections 495a, 495b. In one embodiment, the gaps 497a, 497b may facilitate venting of air and/or outgassing. Also, where the stiffening element comprises single continuous structure extending about the substrate's periphery (see FIGS. 1A-1B), the stiffener may include grooves, holes, or other passageways to allow for venting and/or outgassing. The sections 495a, 495b of stiffening element 490 may have any suitable widths and thicknesses, as described above.

As noted above, the disclosed bottom-side stiffener may simultaneously minimize package warpage and reduce the risk for shock-related failures. This aspect of the disclosed embodiments is illustrated by the following example. Computer modeling was performed on a package including a die having dimensions of 8 mm by 3 mm and a thickness of 0.4 mm, and a substrate having dimensions of 14 mm by 13 mm and a thickness of 0.687 mm. The substrate had a core 400 microns thick, and the interconnect pitch was 0.6 mm. The bottom-side stiffening element was a rectangular frame shape having two opposing sides 352 microns in width and the other two opposing sides 428 microns in width. Further, the stiffener had a thickness of 257 microns and was comprised of copper. If this stiffener were mounted to the upper or die-side of the substrate, modeling suggests that there is a 4× increase in shock risk as compared to this package with no stiffener. However, with the stiffener mounted on the bottom-side of the substrate and also adhered to the underlying circuit board, modeling suggests that the shock risk decreases by approximately 68 percent, as compared to this package with no stiffener. This modeling also suggested that the bottom-side stiffener provided greater warpage reduction (21 percent) than the die-side mounted stiffener (6 percent reduction), as compared to the package with no stiffener.

Another potential advantage is that a bottom-side stiffener may be more effective than a die-side stiffener in reducing room temperature warpage, because the CTE mismatch driven warpage superimposed by the bottom-side stiffener is opposite in sign to that of the assembly driven warpage. However, the effectiveness of the bottom-side stiffener at reducing room temperature warpage may be dependent upon the materials selected for the stiffener, package substrate, and underlying circuit board.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. An assembly comprising:
   a circuit board having a first side and an opposing second side;
   a substrate having a first side and an opposing second side, wherein the second side of the substrate faces the first side of the circuit board;
   an integrated circuit die disposed on the first side of the substrate;
   a number of interconnects electrically coupling the substrate to the circuit board; and
   a stiffening element disposed between the substrate and circuit board;
   wherein the stiffening element is attached to the second side of the substrate; and wherein the stiffening element is attached to the first side of the circuit board by an adhesive, or a solder, or a mechanical fastener such that the stiffening element is fixed in all directions.

2. The assembly of claim 1, wherein the stiffening element comprises a generally rectangular-shaped frame.

3. The assembly of claim 2, wherein the frame-shaped stiffening element is disposed proximate a periphery of the substrate.

4. The assembly of claim 3, wherein the frame-shaped stiffening element extends about a full extent of the substrate's periphery.

5. An assembly comprising:
a circuit board having a first side and an opposing second side;
a substrate having a first side and an opposing second side, wherein the second side of the substrate faces the first side of the circuit board;
an integrated circuit die disposed on the first side of the substrate;
a number of interconnects disposed between the substrate and the circuit board, the interconnects electrically coupling the substrate to the circuit board; and
a stiffening element disposed between the substrate and the circuit board, the stiffening element attached to the second side of the substrate, wherein the stiffening element comprises a generally rectangular-shaped frame disposed on a periphery of the substrate;
wherein the stiffening element comprises a first pair of opposing lengths and a second pair of opposing lengths, the first pair of opposing lengths having a first width and the second pair of opposing lengths having a second width less than the first width, the first pair of opposing lengths having a longer external length than the second pair of opposing lengths.

6. The assembly of claim 5, wherein the stiffening element is attached to the first side of the circuit board.

7. The assembly of claim 6, wherein the stiffening element is attached to the first side of the circuit board by an adhesive or by solder.

8. The assembly of claim 5 wherein the stiffening element surrounds all of the interconnects coupling the substrate to the circuit board and none of the interconnects are disposed outside of the stiffening element.

9. An assembly comprising:
a circuit board having a first side and an opposing second side;
a substrate having a first side and an opposing second side, wherein the second side of the substrate faces the first side of the circuit board;
an integrated circuit die disposed on the first side of the substrate;
a number of interconnects electrically coupling the substrate to the circuit board; and
a stiffening element disposed between the substrate and circuit board;
wherein the stiffening element is attached to the second side of the substrate;
wherein the stiffening element is attached to the first side of the circuit board by an adhesive, or a solder, or a mechanical fastener such that the stiffening element is fixed in all directions; wherein the stiffening element comprises a generally rectangular-shaped frame; and wherein the stiffening element comprises a first pair of opposing lengths and a second pair of opposing lengths, the first pair of opposing lengths having a first width and the second pair of opposing lengths having a second width less than the first width.

* * * * *